US007514865B2

(12) United States Patent
Yamazaki et al.

(10) Patent No.: US 7,514,865 B2
(45) Date of Patent: Apr. 7, 2009

(54) DISPLAY PANEL AND DISPLAY DEVICE

(75) Inventors: Tetsuro Yamazaki, Suwa (JP); Takashi Takeda, Suwa (JP); Masatoshi Yonekubo, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 529 days.

(21) Appl. No.: 11/114,113

(22) Filed: Apr. 26, 2005

(65) Prior Publication Data
US 2005/0242710 A1 Nov. 3, 2005

(30) Foreign Application Priority Data
Apr. 30, 2004 (JP) ............... 2004-135941

(51) Int. Cl.
H05B 33/12 (2006.01)
H05B 33/14 (2006.01)

(52) U.S. Cl. ............... 313/507; 313/498; 313/504

(58) Field of Classification Search ......... 313/495–512; 315/169.3, 169.4; 257/40, 79; 428/690; 345/30, 36, 44, 45
See application file for complete search history.

(56) References Cited

U.S. PATENT DOCUMENTS

| 4,808,880 A | 2/1989 | Thioulouse |
| 4,877,995 A | 10/1989 | Thioulouse et al. |
| 5,548,420 A * | 8/1996 | Koshimizu et al. ............ 349/21 |
| 6,091,382 A * | 7/2000 | Shioya et al. ............... 345/76 |
| 6,653,796 B2 | 11/2003 | Kimura |
| 6,821,553 B2 | 11/2004 | Miyashita et al. |
| 6,833,156 B2 | 12/2004 | Miyashita et al. |
| 6,838,192 B2 | 1/2005 | Miyashita et al. |
| 6,863,961 B2 | 3/2005 | Miyashita et al. |
| 2002/0136823 A1 | 9/2002 | Miyashita et al. |
| 2005/0042477 A1 | 2/2005 | Miyashita et al. |

FOREIGN PATENT DOCUMENTS

| CN | A 1236825 | 1/1999 |
| CN | 1212114 A | 3/1999 |
| JP | A 62-501180 | 5/1987 |
| JP | A 09-185332 | 7/1997 |
| JP | 11-354283 | 12/1999 |
| JP | A 2001-052876 | 2/2001 |
| JP | A-2001-171175 | 6/2001 |
| JP | A 2002-043065 | 2/2002 |
| JP | A 2004-127608 | 4/2004 |
| JP | A-2004-191839 | 7/2004 |

* cited by examiner

Primary Examiner—Joseph L Williams
Assistant Examiner—Elmito Breval
(74) Attorney, Agent, or Firm—Oliff & Berridge, PLC

(57) ABSTRACT

Exemplary embodiments of the invention provide a display panel, etc. which can be controlled by optical addressing, and which are simple in construction and can reduce costs. According to exemplary embodiments, a display device includes a first transparent electrode layer and a second transparent electrode layer which are optically transparent, a variable conductivity layer which is disposed on the first transparent electrode layer and whose electrical conductivity is changed in accordance with the light quantity of control light L transmitted through the first transparent electrode layer, and a functional layer having at least a light emission layer, which is stacked on the variable conductivity layer and which is interposed between the variable conductivity layer and the second transparent electrode layer. A predetermined voltage is applied between the first transparent electrode layer and the second transparent electrode layer, and the light emission layer emits light in accordance with the light quantity of the control light L.

5 Claims, 5 Drawing Sheets

F I G. 1
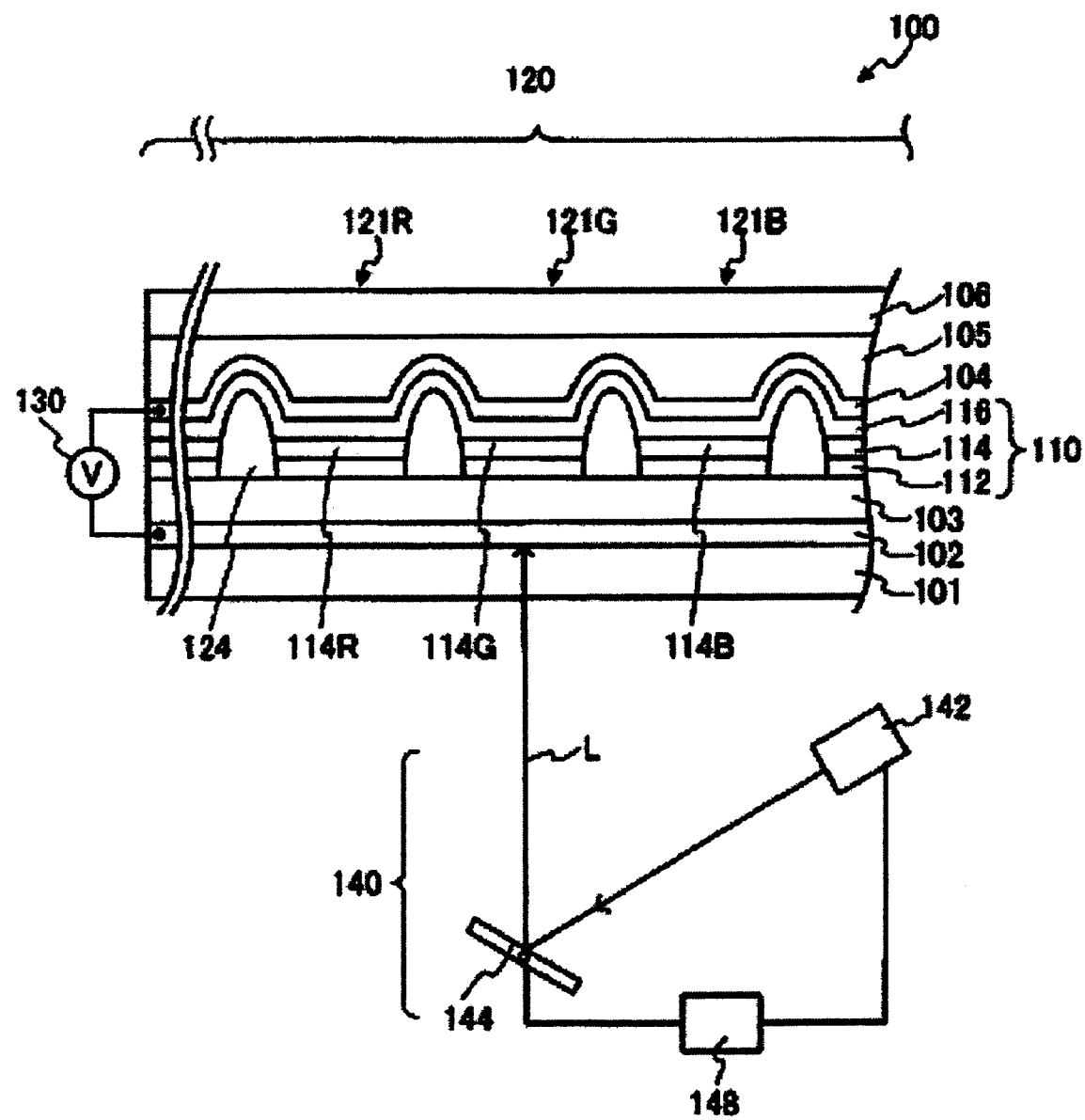

F I G. 2
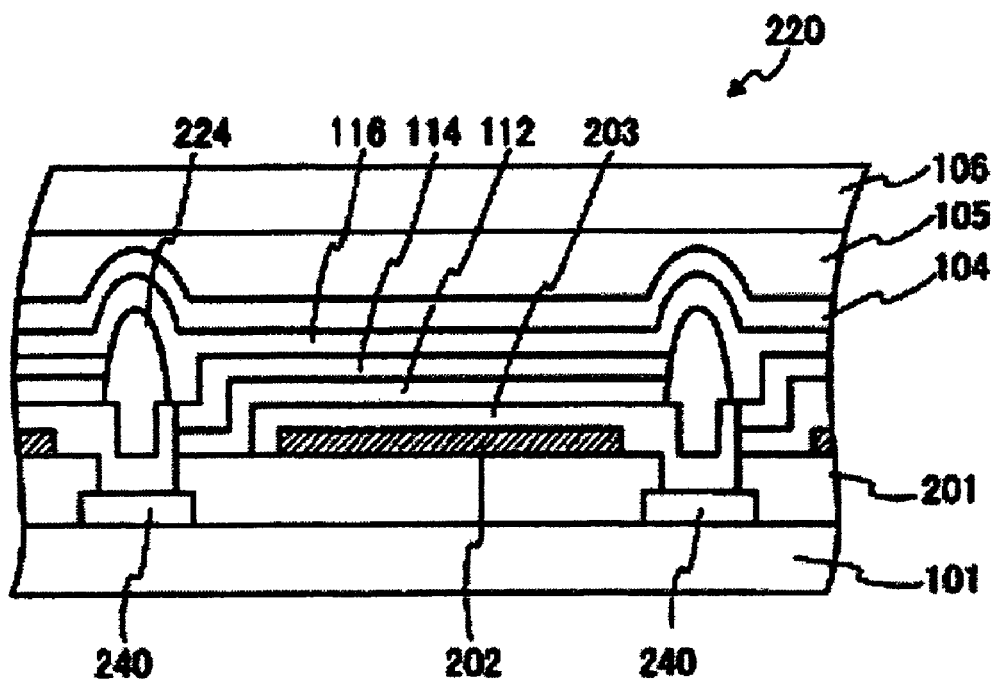

DISPLAY PANEL AND DISPLAY DEVICE

BACKGROUND

Exemplary embodiments of the present invention relate to a display panel and a display device. Exemplary embodiments also relate to the technology of a display panel for use in a display device which is controllable by light.

An organic EL display, for example, has been employed as an image display device as disclosed in related art document "Organic EL Materials and Displays "published by CMC, ISBN: 4-88231-284-0 C3054, Chapter 19" "Drive methods for Organic EL displays" written by Shingo Kawashima, p. 279-289.

SUMMARY

A related art organic EL display is provided with thin film transistor (hereinbelow, termed "TFT") elements. Each of the TFT elements has its ON/OFF state controlled by access employing a current. When the number of pixels is increased with the enlargement of the size of a screen, the number of the TFT elements also is increased. Accordingly, the construction of the organic EL display becomes complicated and it becomes difficult to uniformalize the performances of the TFT elements. Further, when the number of the TFT elements increases, the number of wiring lines increases, and hence, also the electrical resistance of the organic EL display increases. As such, it is difficult to enlarge in size, the related art organic EL display.

A display panel which is controllable by projecting control light can be applied to a display device employing an EL element. The display panel, which is controlled by employing the control light, can be driven by irradiating the display panel with the control light which corresponds to an image signal. The display panel employing the control light dispenses with the TFT elements and the various wiring lines for the electrical accesses. With the control light, therefore, it is considered that the display will be simplified in construction and be easily enlargeable in size. It shall be termed the "control based on the optical addressing" below that the display panel is controlled by projecting the control light.

A related art organic EL display includes anode electrodes which are disposed in correspondence with pixel regions. An aluminum layer, for example, is employed as each anode electrode. The aluminum layer is disposed in the whole pixel region in order to diffuse a current within the pixel region. Besides, in the case of disposing the aluminum layer as the anode electrode, an ITO film, for example, is disposed in order to narrow the hole transport barrier between the anode electrode and a transport layer. Such aluminum layers and ITO films are patterned and formed for respective pixels because the current needs to be reduced or prevented from diffusing astride the pixels. In a case where light emission layers are partitioned by employing banks, the aluminum layers and the ITO films are patterned so as to correspond to the positions among the banks. Besides, the banks are formed at positions registered with parts other than the stacked parts of the aluminum layers and the ITO films. Therefore, alignment of very high precision is required for forming the aluminum layers, ITO films and banks. The organic EL display sometimes incurs the lowering of available percentage and the rise of a cost on account of such complicated processes. As stated above, in spite of the advantage that the display panel can be made simple in construction by performing the control based on the optical addressing, it has the problem that it sometimes incurs the lowering of the available percentage or the high cost.

Exemplary embodiments of the present invention have been made in view of the above discussed and/or other problems. Exemplary embodiments provide a display panel which is capable of the control based on the optical addressing and which can reduce a cost owing to a simple construction, and a display device which employs the display panel.

In order to address or solve the above discussed and/or other problems, according to exemplary embodiments of the present invention, it is possible to provide a display panel characterized by including a first transparent electrode layer and a second transparent electrode layer which are optically transparent; a variable conductivity layer which is disposed on the first transparent electrode layer, and whose electrical conductivity is changed in accordance with a light quantity of control light transmitted through the first transparent electrode layer; and a functional layer having, at least, a light emission layer, which is stacked on the variable conductivity layer, and which is interposed between the variable conductivity layer and the second transparent electrode layer. A predetermined voltage is applied between the first transparent electrode layer and the second transparent electrode layer, and the light emission layer emits light in accordance with the light quantity of the control light. Besides, in a preferable exemplary aspect of the invention, it is desirable that the function layer includes a hole transport layer which is stacked and disposed on the variable conductivity layer, the light emission layer which is disposed on the hole transport layer, and an electron transport layer which is interposed between the light emission layer and the second transparent electrode layer; that the hole transport layer transports holes to the light emission layer in such a way that, of the predetermined voltage, a voltage corresponding to the conductivity of the variable conductivity layer is applied to the hole transport layer; that the electron transport layer transports electrons to the light emission layer in such a way that, of the predetermined voltage, a voltage corresponding to the conductivity of the variable conductivity layer is applied to the electron transport layer; and that the light emission layer emits the light in accordance with the light quantity of the control light on the basis of the holes from the hole transport layer and the electrons from the electron transport layer.

When the control light is not entered, the variable conductivity layer functions as an insulating layer whose electrical conductivity is substantially zero. Besides, when the control light is entered, the variable conductivity layer has its electrical conductivity changed in accordance with the light quantity of the control light transmitted through the first transparent electrode layer. When the predetermined voltage is held applied between the first transparent electrode layer and the second transparent electrode layer, that voltage of the predetermined voltage which corresponds to the light quantity of the control light can be applied to the light emission layer. The light emission layer emits the light in accordance with the light quantity of the control light in such a way that the voltage corresponding to the light quantity of the control light is applied thereto. The display panel is capable of a control based on optical addressing, by employing the variable conductivity layer.

The variable conductivity layer changes the conductivity only in its region irradiated with the control light. Besides, since the hole transport layer and the light emission layer have very small layer thicknesses, they do not diffuse currents in a direction parallel to a substrate surface, and they become conductive only in the region of the variable conductivity layer where the conductivity has changed. For this reason, in the case of performing the optical addressing, the display panel can be driven every pixel even when the variable conductivity layer, hole transport layer and light emission layer are not insulated for the respective pixels. Therefore, the display panel can be made a construction which is manufacturable without making alignment of high precision every pixel. Especially in a case where a display is presented with single color light, the display panel can be made a construction in which all the layers are disposed uniformly over a substrate, without employing a construction which corresponds to the pixels. In this case, the display panel can be more easily formed in such a way that materials for forming the respective layers are successively provided by uniform coating operations over the substrate.

A display panel which presents a display with a plurality of color lights employs a plurality of light emission layers. Also in this case, the light emission layers can be formed in correspondence with the pixels without making the alignment of the high precision, in contrast to the case of applying the construction of the related art display panel. Further, the display panel can reduce a cost by decreasing the sorts of materials for formations and the number of times of film formations. The display panel can perform the injection of the holes into the light emission layer as efficiently as in the related art, by employing for the variable conductivity layer a material whose work function relieves the hole transport barrier between the first transparent electrode layer and the hole transport layer. Thus, it is possible to obtain the display panel which is capable of the control based on the optical addressing, and which can reduce the cost owing to the simple construction.

Besides, in a preferable aspect of exemplary embodiments of the invention, the light emission layer should desirably include a light emission layer for first color light, which is disposed in correspondence with a pixel for the first color light as supplies the first color light, a light emission layer for second color light, which is disposed in correspondence with a pixel for the second color light as supplies the second color light, and a light emission layer for third color light, which is disposed in correspondence with a pixel for the third color light as supplies the third color light. The light emission layers for the respective color lights can be manufactured without making the alignment of the high precision, in contrast to the case of applying the construction of the related art display panel. Thus, it is possible to obtain the full-color display panel which can reduce the cost owing to the simple construction.

Besides, in a preferable aspect of exemplary embodiments of the invention, light from another image display device should desirably be employed as the control light. Thus, it is possible to obtain the display panel which is capable of displaying the image of the other image display device.

Further, according to exemplary embodiments of the invention, it is possible to provide a display device characterized by including the above display panel; a power source which applies the predetermined voltage to the display panel; and an optical system for the control light as supplies the control light to the display panel. The cost can be reduced with the simple construction, by employing the above display panel. Thus, it is possible to obtain the display device which can reduce the cost owing to the simple construction.

BRIEF DESCRIPTION OF THE DRAWINGS

FIG. 1 is a schematic showing a display device according to Exemplary Embodiment 1 of the present invention;

FIG. 2 is a schematic showing the construction of a related art display panel;

DETAILED DESCRIPTION OF EMBODIMENTS

Figure 3:
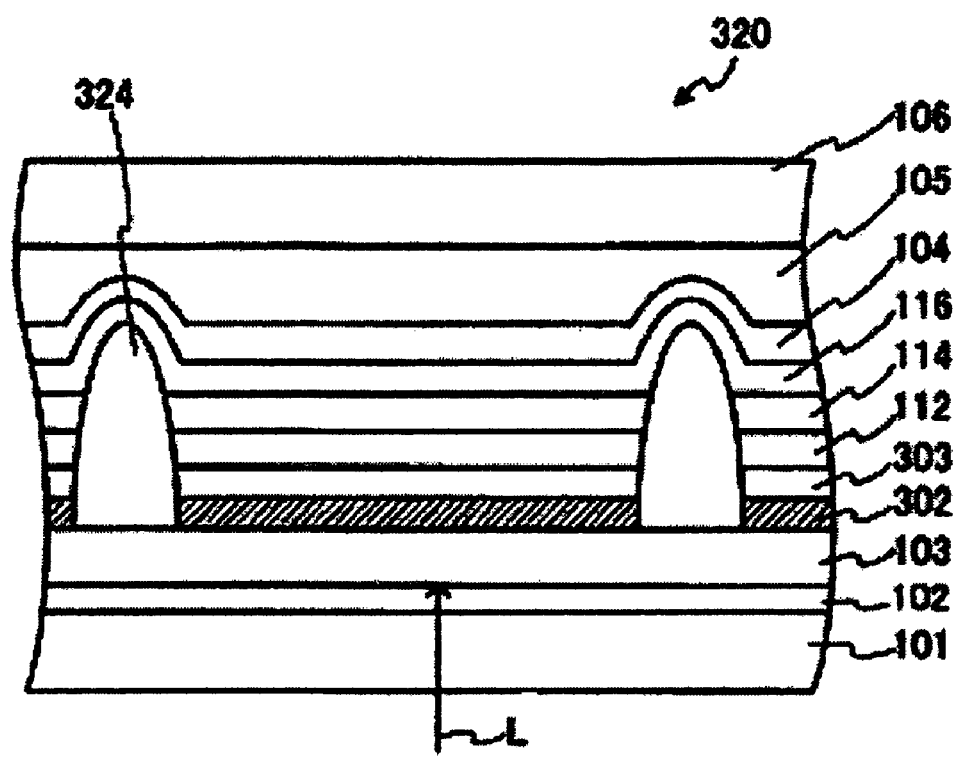
FIG. 3 is a schematic showing a constructional example of a display panel which is controlled by optical addressing.

Now, exemplary embodiments of the present invention will be described in detail with reference to the drawings.

Exemplary Embodiment 1

FIG. 1 is a schematic showing a display device 100 according to Exemplary Embodiment 1 of the invention. The display device 100 is an organic EL display. The display device 100 is constructed of a display panel 120, a power source 130, and an optical system for control light, 140. The display panel 120 displays an image owing to the light emission of light emission layers 114. The power source 130 applies a predetermined voltage between the first transparent electrode layer 102 and second transparent electrode layer 104 of the display panel 120. The optical system for control light, 140 supplies the control light L to the display panel 120. In FIG. 1, the display panel 120 has the sectional construction of its essential portions illustrated.

The substrate 101 of the display panel 120 is a parallel flat plate which is made of a glass member, a polymer member or the like being optically transparent. The substrate 101 is overlaid with the first transparent electrode layer 102. The first transparent electrode layer 102 is an anode electrode which is made of an optically transparent member. The first transparent electrode layer 102 can be made from, for example, ITO. The first transparent electrode layer 102 made from the ITO is formed at a layer thickness of, for example, 200 nm. An amorphous silicon (hereinbelow, termed "a-Si") layer 103 being a variable conductivity layer is disposed on the first transparent electrode layer 102. The a-Si layer 103 has its electrical conductivity changed by the control light L transmitted through the first transparent electrode layer 102. The a-Si layer 103 is formed at a thickness of, for example, 5 µm.

The a-Si layer 103 should desirably contain, for example, hydrogen. The a-Si layer 103 functions as an insulating member whose electrical conductivity is substantially zero (that is, whose resistance is substantially infinity) in a state where it is not irradiated with the control light L at all. In contrast, when the a-Si layer 103 is irradiated with the control light L, the conductivity increases (that is, the resistance decreases) in accordance with the light quantity of the control light. That region of the a-Si layer 103 in which the conductivity changes corresponds to that region of the first transparent electrode layer 102 which has been irradiated with the control light L. The first transparent electrode layer 102 and the a-Si layer 103 are disposed uniformly on the surface of the substrate 101. The first transparent electrode layer 102 can be formed by, for example, evaporation. The a-Si layer 103 can be formed by chemical vapor deposition (CVD).

The a-Si layer 103 is overlaid with banks 124 and a functional layer 110. The functional layer 110 is stacked on the a-Si layer 103, and is interposed between the a-Si layer 103 and the second transparent electrode layer 104. The functional layer 110 is configured of hole transport layers 112, the light emission layers 114 and an electron transport layer 116 which are successively stacked. The banks 124 are disposed in the shape of a lattice in two, substantially orthogonal directions over the surface of the substrate 101. The hole transport layers 112 are stacked and disposed on those regions of the a-Si layer 103 which lie among the banks 124. Each hole transport layer 112 transports holes and injects them into the light emission layer 114 in such a way that, of a predetermined voltage from the power source 130, a voltage corresponding to the conductivity of the a-Si layer 103 is applied to this hole transport layer. For example, 3,4-polyethylene dioxythiophene (PEDOT), can be employed for the hole transport layer 112. The hole transport layer 112 made from the PEDOT is formed at a layer thickness of, for example, 20 nm.

The light emission layer 114 is disposed on the hole transport layer 112. The light emission layer 114 emits light in accordance with the light quantity of the control light L on the basis of the holes from the hole transport layer 112 and electrons from the electron transport layer 116. The light emission layer 114 can be made from a (poly)paraphenylene vinylene derivative (PPV). Apart from the PPV, a light emission layer for G light, 114G may well be made from any of a polyfluorene derivative (PF), a polyphenylene derivative (PP), a polyparaphenylene derivative (PPP), polyvinylcarbazole (PVK), a polythiophene derivative, a perylene pigment, a coumarin pigment and a rhodamine pigment, or any other low-molecular organic EL material or high-molecular organic EL material which is soluble in a benzene derivative.

The light emission layer 114 is divided into light emission layers for respective color lights, 114R, 114G and 114B by the banks 124. The light emission layer for the R light, 114R which is the light emission layer for the first color light is disposed in correspondence with pixels for the R light, 121R which supply the R light being the first color light. The light emission layer for the G light, 114G which is the light emission layer for the second color light is disposed in correspondence with pixels for the G light, 121G which supply the G light being the second color light. The light emission layer for the B light, 114B which is the light emission layer for the third color light is disposed in correspondence with pixels for the B light, 121B which supply the B light being the third color light. Each of the light emission layers for the respective color lights, 114R, 114G and 114B is formed at a layer thickness of, for example, 15 nm.

The electron transport layer 116 and the second transparent electrode layer 104 are successively stacked and disposed on the light emission layers for the respective color lights, 114R, 114G and 114B and the banks 124. The electron transport layer 116 transports the electrons and injects them into the light emission layer 114 in such a way that, of the predetermined voltage from the power source 130, a voltage corresponding to the conductivity of the a-Si layer 103 is applied to this electron transport layer. The electron transport layer 116 can be made from, for example, calcium. In a case where the electron transport layer 116 is made from the calcium, it is formed at a layer thickness of, for example, 20 nm.

The second transparent electrode layer 104 is a cathode electrode which is made of an optically transparent member. The second transparent electrode layer 104 can be made from, for example, ITO likewise to the first transparent electrode layer 102. The second transparent electrode layer 104 formed from the ITO is formed at a layer thickness of, for example, 200 nm. Each of the electron transport layer 116 and the second transparent electrode layer 104 can be formed by, for example, evaporation. The second transparent electrode layer 104 is overlaid with a sealing layer 105 and a substrate 106. The sealing layer 105 prevents the layers between the substrates 101 and 106 from deteriorating due to oxidation etc. The sealing layer 105 can be formed from, for example, a UV-curing resin and silicon nitroxide. Incidentally, the display panel 120 may well be so constructed that an optical element for causing the light to efficiently exit from the light emission layer 114 is disposed on the exit surface of the substrate 106.

The optical system for the control light, 140 is constructed of a galvano-mirror 144 and a light source unit for the control light, 142. The optical system for the control light, 140 is disposed on the side of the display panel 120 near to the substrate 101. The light source unit for the control light, 142 supplies the control light L which is beam-shaped light, for example, a laser beam. Usable as the light source unit for the control light, 142 is, for example, a semiconductor laser element or a vertical cavity surface emitting laser (VCSEL) element which is furnished with a modulator. The light source unit for the control light, 142 supplies the control light L whose intensity is modulated in accordance with an image signal from a control unit 148. The control light L from the light source unit for the control light, 142 is reflected toward the display panel 120 by the galvano-mirror 144. Besides, the control light L reflected toward the display panel 120 enters the surface of the substrate 101 of the display panel 120.

The galvano-mirror 144 can be fabricated by, for example, MEMS (Micro Electro Mechanical Systems) technology. The galvano-mirror 144 turns about two predetermined axes being substantially orthogonal to each other, thereby to project the control light in two directions. The turning of the galvano-mirror 144 is controlled in accordance with the image signal by the control unit 148. In this way, the optical system for the control light, 140 scans the surface of the substrate 101 of the display panel 120 with the control light L. Light of wavelength region capable of changing the electrical conductivity of the a-Si Layer 103 is employed as the control light L. The wavelength and light quantity of the control light L are appropriately determined in accordance with the magnitude of a current which is conducted through the display panel 120. An ultraviolet laser, a visible light laser or an infrared laser can be employed for the control light L. Besides, the laser beam is not restrictive, but beam-shaped light, for example, light from a light emitting diode element (LED) may well be used as the control light L.

Here, it is assumed that the control light L has entered a position on the surface of the substrate 101 as corresponds to the pixel for the G light, 121G. The control light L from the optical system for the control light, 140 is transmitted through the substrate 101 and the first transparent electrode layer 102 of the display panel 120, thereby to enter the a-Si layer 103. When the control light L at the intensity corresponding to the image signal has entered the a-Si layer 103, this a-Si layer 103 has its electrical conductivity increased at the entrance position of the control light L in accordance with the light quantity of the control light L. Incidentally, strictly speaking, the region where the conductivity of the a-Si layer 103 changes tends to expand to the surroundings round the irradiated position, in proportion to the intensity and irradiation time period of the control light L. Here, it is assumed that the substrate surface is scanned with the control light L at high speed by the galvano-mirror 144, so the conductivity changes only in the vicinity of the region irradiated with the control light L.

The first transparent electrode layer 102 and the second transparent electrode layer 104 are electrically connected with the power source 130. Owing to the increase of the conductivity of the a-Si layer 103, voltages corresponding to the conductivity of the a-Si layer 103 are applied to the respective layers between the first transparent electrode layer 102 and the second transparent electrode layer 104. When the voltages are applied between the first transparent electrode layer 102 and the second transparent electrode layer 104, the hole transport layer 112 transports the holes from the first transparent electrode layer 102 and injects them into the light emission layer for the G light, 114G Besides, the electron transport layer 116 transports the electrons from the second transparent electrode layer 104 and injects them into the light emission layer for the G light, 114G.

When the electrons and the holes are combined in the light emission layer for the G light, 114G, the fluorescent substance of the light emission layer for the G light, 114G is excited by energy which is produced at the combination between the electrons and the holes. Besides, the fluorescent substance of the light emission layer for the G light, 114G gives rise to a light emission phenomenon in reverting from its excited state into its ground state. On this occasion, the fluorescent substance of the light emission layer for the G light, 114G emits light whose spectrum has a peak wavelength in the region of the G light. In this way, the light emission layer for the G light, 114G emits the G light. Incidentally, regarding each of the light emission layer for the R light, 114R and the light emission layer for the B light, 114B, a construction and a light emission mechanism are similar to those in the case of the light emission layer for the G light, 114G The light emission layer for the R light, 114R has a fluorescent substance whose light emission spectrum has a peak wavelength in the region of the R light. Also, the light emission layer for the B light, 114B has a fluorescent substance whose light emission spectrum has a peak wavelength in the region of the B light. The display panel 120 causes the lights to exit onto the side of the substrate 106 from the light emission layers for the respective color lights, 114R, 114G and 114B.

Next, the display panel 120 of exemplary embodiments of the invention will be described in comparison with display panels in the related art. FIG. 2 is a schematic showing the related art display panel 220 which employs TFT elements 240. The TFT elements 240 are disposed on a substrate 101. A flattening layer 201 is disposed for flattening rugged parts ascribable to the formation of the TFT elements 240 on the substrate 101, so as to facilitate uniformalizing the layer thicknesses of individual layers. Aluminum layers 202 being anode electrodes are disposed on the flattening layer 201. The aluminum layers 202 are disposed over the whole pixel region in correspondence with pixels, whereby currents from the TFT elements 240 are diffused into the pixels. An ITO film 203 is interposed between each aluminum layer 202 and a hole transport layer 112. The ITO film 203 is disposed in order to narrow the hole transport barrier between the aluminum layer 202 and the hole transport layer 112. The aluminum layers 202 and the ITO films 203 are patterned and formed at the positions among banks 224 for the reason that the currents need to be reduced or prevented from diffusing astride the pixels.

The TFT elements 240 are electrically accessed using various wiring lines not shown, thereby to control their ON/OFF states. Since the display panel is driven every pixel, the TFT elements 240 are disposed in correspondence with all the pixels. When the number of the pixels is increased with the enlargement of the size of a screen, also the number of the TFT elements 240 increases. In this case, the construction of the display panel 220 becomes complicated, and besides, it becomes difficult to manufacture the TFT elements 240 of uniform performances. Further, when the number of the TFT elements 240 increases, the number of the wiring lines increases, and hence, also the electrical resistance of the display panel 220 increases. For these reasons, the related art display panel 220 comes to have the complicated construction and sometimes incurs the rise of a cost, especially due to the enlargement of the size.

FIG. 3 is a schematic showing an example of the display panel 320 which is controlled by optical addressing. The display panel 320 applies the construction of the display panel 220 shown in FIG. 2. The display panel 320 is provided with a first transparent electrode layer 102 and an a-Si layer 103 instead of the TFT elements and the various wiring lines. Since the TFT elements and the various wiring lines are dispensed with, the display panel 320 can be made a simple construction of low cost.

Likewise to the display panel 220 shown in FIG. 2, the display panel 320 is formed with an aluminum layer 302 and an ITO film 303 every pixel. The aluminum layer 302 and the ITO film 303 are formed by the whole-area film formation of a material based on evaporation or the like, and pattern formation and etching based on photolithography. Banks 324 are formed in correspondence with positions at which the aluminum layer 302 and the ITO film 303 have been removed by the etching. In order to reduce or prevent the pixels from becoming conductive with one another, the aluminum layers 302, ITO films 303 and banks 324 need to be formed at precise positions. Therefore, an alignment of very high precision is required for forming the aluminum layers 302, ITO films 303 and banks 324. Notwithstanding that the display panel 320 adopts the optical addressing in order to realize the simple construction of low cost, it sometimes undergoes the lowering of available percentage and the rise of the cost, on account of the complicated manufacturing process.

Referring back to FIG. 1, the display panel 120 of the invention has the hole transport layers 112 disposed on the a-Si layer 103. As explained before, the a-Si layer 103 becomes conductive only at the position which the control light L has entered. Therefore, the display panel 120 can be driven every pixel even when the a-Si layers 103 are not formed for the respective pixels. Besides, a-Si from which the a-Si layer 103 is made has a work function which is capable of relieving the hole transport barrier between the first transparent electrode layer 102 and the hole transport layer 112. Accordingly, the display panel 120 can employ the a-Si layer 103 formed over the whole area of the display panel 120, instead of the aluminum layers and the ITO films provided for the respective pixels.

The hole transport layers 112 and the light emission layers 114 can be formed by a liquid drop discharge method such as ink jetting. First, the hole transport layers 112 are formed in such a way that the material for the formation is discharged onto those selected areas of the a-Si layer 103 which are surrounded with the banks 124, by employing a liquid-drop discharging head (ink-jetting head). After the formation of the hole transport layers 112, the light emission layers for the R light, 114R are formed in such a way that the material for the formation is selectively discharged onto the hole transport layers 112 corresponding to the pixels for the R light, 121R, by employing a liquid-drop discharging head. Likewise to the light emission layers for the R light, 114R, the light emission layers for the G light, 114G and the light emission layers for the B light, 114B are formed in such a way that the materials for the formations are selectively discharged onto the hole transport layers 112 corresponding to the pixels for the G light, 121G and the pixels for the B light, 121B, by employing liquid-drop discharging heads, respectively. In this way, the hole transport layers 112 and the light emission layers 114 can be easily formed by the liquid drop discharge method. Each of the electron transport layer 116 and the second transport electrode layer 104 can be formed in such a way that the material for the formation is formed into a film over the whole area by evaporation or the like.

The hole transport layers 112 and the light emission layers 114 are provided at very small layer thicknesses of several tens nm. Since the hole transport layers 112 and the light emission layers 114 are very thin, currents diffuse little in a direction parallel to the surface of the substrate 101. The display panel 120 can prevent the currents from diffusing astride the pixels, even when the hole transport layers 112 and the light emission layers 114 are not insulated for the respective pixels. Therefore, the banks 124 are provided for the purpose of forming the light emission layers for the individual color lights, 114R, 114G and 114B in correspondence with the pixels, rather than insulating the respective pixels. The banks 124 suffice with a construction which is capable of partitioning the materials forming the light emission layers for the respective color lights, 114R, 114G and 114B, so that they can be made simpler in construction than the banks 324 of the display panel 320 in FIG. 3.

The banks 324 of the display panel 320 shown in FIG. 3 need to be accurately disposed at the other parts than the stacked parts of the aluminum layers and the ITO films. In contrast, the display panel 120 of the invention can be formed even when its banks are not aligned to the respective pixels so precisely as the banks 324 of the display panel 320. By way of example, the display panel 120 can correct the positional deviations of the banks 124, in forming the hole transport layers 112 and the light emission layers 114R, 114G and 114B. Apart from the method employing the patterning, the banks 124 of the display panel 120 can be easily formed in such a way that a material for the formation is discharged selectively to desired positions by the liquid drop discharge method. In the case of employing the liquid drop discharge method, a material which cures after the discharge, for example, a UV-curing resin or an adhesive, can be employed as the material for forming the banks 124.

As thus far described, the display panel 120 is allowed to have the construction which can be manufactured without making the alignment of high precision every pixel. Besides, since the display panel 120 requires neither of the aluminum layers and the ITO films, it can dispense with complicated processes such as photolithography and etching, and it can decrease the sorts of materials for its formation and the number of times of film formations. Owing to the facts that the complicated processes can be dispensed with, and that the sorts of the materials for the formation and the number of times of the film formations can be decreased, the display panel 120 is permitted to enhance available percentage and to reduce a cost. In this manner, the display panel of the invention can simplify the construction and can reduce the manufacturing cost.

The display panel 120 employs for the variable conductivity layer, the material of the work function which relieves the hole transport barrier between the first transparent electrode layer 102 and the hole transport layers 112, whereby it can inject the holes into the light emission layers 114 as efficiently as in the prior art. Besides, even in the case of the construction in which the light emission layers for the respective color lights, 114R, 114G and 114B are disposed, the display panel 120 can be manufactured without aligning these light emission layers to the respective pixels at high precision. Thus, the display panel 120 attains the advantages that it can be controlled by optical addressing, and that it can reduce the cost owing to the simple construction. Since complicated manufacturing processes such as the high-precision alignment are dispensed with, the display panel 120 can be easily enlarged in size. Besides, the full-color display panel 120 is obtained by disposing the light emission layers for the respective color lights, 114R, 114G and 114B.

Incidentally, although the display panel 120 of this embodiment has the construction employing the a-Si layer 103 as the variable conductivity layer, this is not restrictive. Any member whose conductivity is changed by light and which has the work function adapted to relieve the hole transport barrier can be employed similarly to the a-Si layer as the variable conductivity layer. Besides, the display panel 120 is not restricted to the case of the construction in which the light emission layers for the respective color lights, 114R, 114G and 114B are partitioned using the banks 124. By way of example, the display panel 120 may well be such that the hole transport layer 112 is also formed over the whole surface, and that the boundary parts of the light emission layers for the respective color lights, 114R, 114G and 114B are marked with a water-repellent substance. In this case, the water-repellent substance can be discharged to desired positions by the liquid drop discharge method. The light emission layers for the respective color lights, 114R, 114G and 114B have the materials for their formations are repelled at the marked positions, whereby they can be formed at desired positions.

To the contrary, positions at which the light emission layers for the respective color lights, 114R, 114G and 114B are to be disposed may well be marked with a hydrophilic substance. In this case, the light emission layers for the respective color lights, 114R, 114G and 114B can be formed at the desired positions in such a way that the material for their formations are confined to the marked positions. Further, in a case where the materials for forming the light emission layers for the respective color lights, 114R, 114G and 114B can be dropped precisely to the desired positions, the display panel 120 may well form these light emission layers for the respective color lights, 114R, 114G and 114B without employing the banks 124, the marks or the likes.

In this case, the light emission layers for the respective color lights, 114R, 114G and 114B can be formed in the shape of dots on a uniform hole transport layer. In this manner, the light emission layers for the respective color lights, 114R, 114G and 114B of the display panel 120 may well be brought into correspondence with the pixels for the respective color lights, 121R, 121G and 121B merely by being formed at the desired positions, apart from the construction in which they are structurally partitioned by the banks 124. In this way, the display panel 120 can be made a still simpler construction by dispensing with the banks 124.

Embodiment 2

Figure 4:
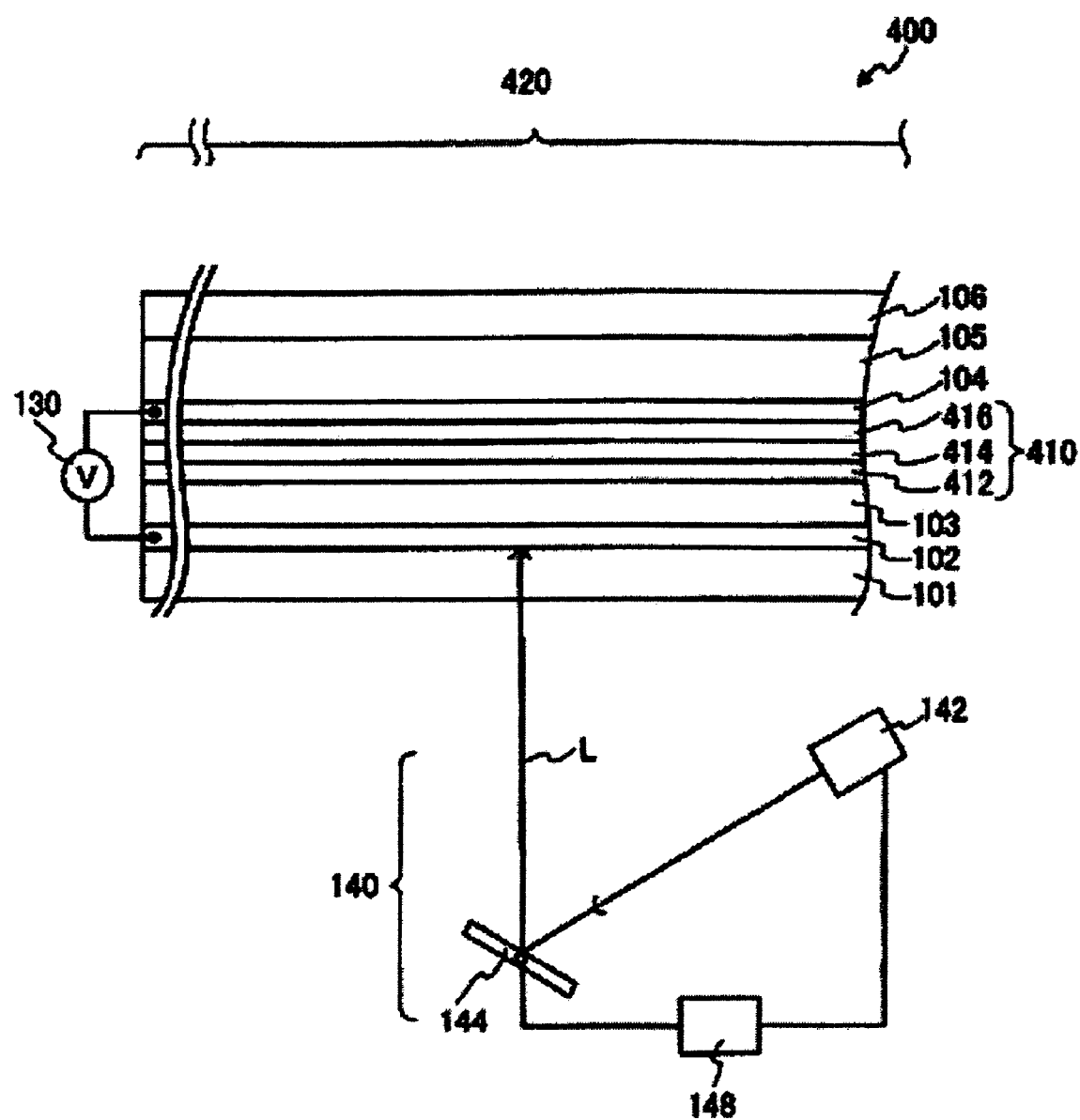
FIG. 4 is a schematic showing a display device according to Exemplary Embodiment 2 of the invention.

FIG. 4 shows the schematic construction of a display device 400 according to Embodiment 2 of the present invention. The display device 400 of this embodiment is the same as the display device 100 of Embodiment 1 described above, as to portions except a display panel 420. The same reference numerals and sign are assigned to the same portions as in Embodiment 1, and they shall be omitted from repeated description. The display device 400 of this embodiment does not employ the construction which corresponds to pixels, but it features a construction in which all the layers are disposed uniformly over the surface of a substrate 101.

A functional layer 410 is disposed on an a-Si layer 103. The functional layer 410 is configured of a hole transport layer 412, a light emission portion 414 and an electron transport layer 416 which are successively stacked. Each of the hole transport layer 412 and the light emission layer 414 is not divided into the pixels, but it is disposed over the whole area of the display panel 420. The light emission layer 414 emits light of specified wavelength region. The display panel 420 presents a display by single color light on the basis of the light of the specified wavelength region from the light emission layer 414. The hole transport layer 412 and the light emission layer 414 can be formed by, for example, spin coating. The electron transport layer 416 and a second transparent electrode layer 104 are disposed over the whole area of the light emission layer 414. Unlike the display panel 120 of Embodiment 1 (refer to FIG. 1) having the banks, the display panel 420 of this embodiment is such that the electron transport layer 416 and the second transparent electrode layer 104 are made of flat surfaces which are substantially parallel to the surface of the substrate 101.

As in the display panel 120 of Embodiment 1, the hole transport layer 412, the light emission layer 414 and the electron transport layer 416 can be made at layer thicknesses of 20 nm, 15 nm and 20 nm, respectively. Also, transparent electrode layers 102 and 105 and the a-Si layer 103 can be made at the same layer thicknesses as in the display panel 120 of Embodiment 1.

The a-Si layer 103 has its conductivity changed only in a region which has been irradiated with control light L. Besides, the hole transport layer 412 and the light emission layer 414 are provided at very small layer thicknesses of several tens nm. The hole transport layer 412 and the light emission layer 414 are very thin, and currents diffuse little in a direction parallel to the surface of the substrate 101. The display panel 420 can satisfactorily prevent the currents from diffusing astride the pixels, even when the hole transport layer 412 and the light emission layer 414 are not insulated for the respective pixels. Therefore, the display panel 420 is permitted to supply the currents only at positions which the control light L has entered. Thus, the display panel 420 can present the display corresponding to an image signal, even when it does not have the construction corresponding to the pixels.

The display panel 420 is constructed by disposing all the layers uniformly over the substrate 101. The individual layers of the display panel 420 can be easily formed in such a way that materials for forming the respective layers are successively provided by coating over the whole area of the substrate 101. This brings forth the advantage that a cost can be reduced owing to a simple construction. Further, since the display panel 420 can be constructed by uniformly disposing all the layers, it can be easily enlarged in size. According to the display device 400 of this embodiment, the monochromatic display of single color can be presented by a simple and inexpensive construction. Incidentally, the display panel 420 may well have a construction which is provided with a plurality of regions each presenting a display in the single color. In this case, the display panel 420 can form the individual layers over the whole area as to the portion which presents the display of the identical color.

(Modification)

Figure 5:
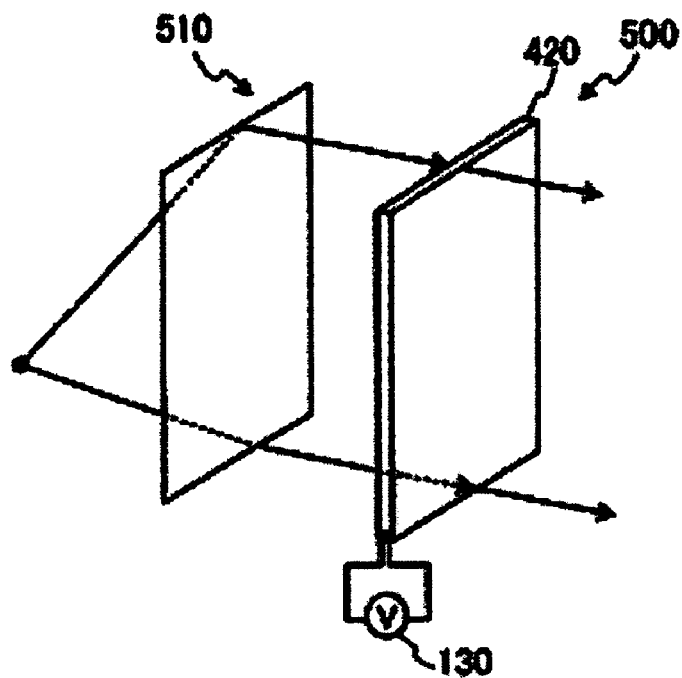
FIG. 5 is a schematic showing a display device according to an exemplary modification to Exemplary Embodiment 2.

FIG. 5 shows the schematic construction of a display device 500 according to a modification to this embodiment. The display device 500 according to this modification features that light from a display 510 being another image display device is employed as control light. Usable as the display 510 is any of, for example, a CRT display, a liquid crystal display and a plasma display. The display panel 420 and the display 510 are arranged so that the display screen of the display 510 and the surface of the display panel 420 near to the side of the substrate 101 (refer to FIG. 4) may be opposed to each other, and that substantially the whole surfaces thereof may correspond to each other. The display 510 causes light rays for displaying an image, to exit. The light rays from the display 510 change the conductivity of the a-Si layer 103 (refer to FIG. 4) at the entrance positions of the display panel 420, respectively. The display panel 420 emits light in correspondence with the display situation of the display 510. This brings forth the advantage that the image of the other image display device can be displayed by the simple construction.

Figure 6:
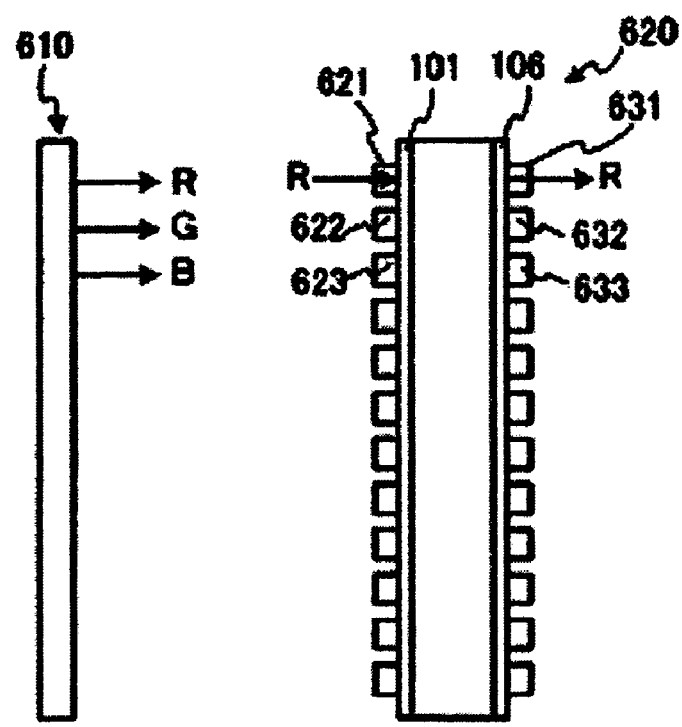
FIG. 6 is a schematic showing a construction in which a display device is provided with color filters.

Further, as in a display panel 620 shown in FIG. 6, color filters may well be disposed on an entrance side for light from a display 610 and an exit side for light from the display panel 620. The display panel 620 includes R-light transmitting color filters 621 and 631, G-light transmitting color filters 622 and 632 and B-light transmitting color filters 623 and 633 on the surface of a substrate 101 and the surface of a substrate 106, respectively, in correspondence with pixels for individual color lights. The R-light transmitting color filter 621 transmits only light of an R component in the light having exited from the display 610. The display panel 620 emits light in accordance with the light quantity of the R-component light transmitted through the R-light transmitting color filter 621, at its part provided with the R-light transmitting color filter 621. Besides, the display panel 620 transmits only the R-component light through the R-light transmitting color filter 631 and causes the transmitted light to exit, at its part having emitted the light in accordance with the light quantity of the R-component light.

Likewise to the R-light, the G-light and B-light are emitted from parts provided with the G-light transmitting color filter 632 and the B-light transmitting color filter 633, respectively. Thus, a full-color image can be obtained by applying the display panel 420 described above. Incidentally, the image display device is not restricted to the display 510 or 610, but a projector or any other device capable of supplying display light can also be employed.

The display panel of each of the above embodiments has the respective layers made of the transparent members. Therefore, when the display panel of each of the embodiments is used in embedment in a transparent member such as show window or glass window, a high stage effect is attained as if an image were displayed on a mere transparent member. The stage effect can be more heightened by employing light other than visible radiation, for example, infrared radiation as the control light in each of the embodiments.

The display device of each of the embodiments is provided with the hole transport layer, the light emission layer and the electron transport layer as the functional layer, but this is not restrictive. The functional layer may include, at least, the light emission layer. Further, the functional layer may well have a construction in which another layer, for example, an electron injection layer is disposed in addition to the hole transport layer, light emission layer and electron transport layer. The display device of each of the embodiments is not restricted to a device for displaying the image, but it may well be one for displaying, for example, an advertisement or guide based on characters, or a signboard or mark. Besides, although the display panel of each of the embodiments employs the organic EL, it is not restricted thereto as long as it emits light by applying a voltage. By way of example, an inorganic EL may well be employed instead of the organic EL.

INDUSTRIAL APPLICABILITY

As described above, a display device according to the present invention is useful for a presentation and in case of displaying a dynamic image.

What is claimed is:

1. A display panel, comprising:

a first optically transparent electrode layer;

a second optically transparent electrode layer;

a variable conductivity layer disposed on the first optically transparent electrode layer, and having an electrical conductivity that is changed in accordance with a quantity of control light transmitted through the first transparent electrode layer;

a functional layer having, at least, a light emission layer, which is stacked on the variable conductivity layer, and which is interposed between the variable conductivity layer and the second transparent electrode layer;

a predetermined voltage applied between the first transparent electrode layer and the second transparent electrode layer; and the light emission layer emitting light in accordance with the quantity of the control light.

2. The display panel according to claim 1, the function layer including a hole transport layer which is stacked and disposed on the variable conductivity layer, the light emission layer which is disposed on the hole transport layer, and an electron transport layer which is interposed between the light emission layer and the second transparent electrode layer;

the hole transport layer transporting holes to the light emission layer in such a way that, of the predetermined voltage, a voltage corresponding to the conductivity of the variable conductivity layer is applied to the hole transport layer;

the electron transport layer transporting electrons to the light emission layer in such a way that, of the predetermined voltage, a voltage corresponding to the conductivity of the variable conductivity layer is applied to the electron transport layer; and the light emission layer emitting the light in accordance with the quantity of the control light on a basis of the holes from the hole transport layer and the electrons from the electron transport layer.

3. The display panel according to claim 1, the light emission layer including a light emission layer for a first color light, which is disposed in correspondence with a pixel for the first color light as supplies the first color light, a light emission layer for a second color light, which is disposed in correspondence with a pixel for the second color light as supplies the second color light, and a light emission layer for a third color light, which is disposed in correspondence with a pixel for the third color light as supplies the third color light.

4. The display panel according to claim 1, light from another image display device being employed as the control light.

5. A display device, comprising:

the display panel according to claim 1;

a power source which applies the predetermined voltage to the display panel; and an optical system for the control light as supplies the control light to the display panel.

* * * * *

UNITED STATES PATENT AND TRADEMARK OFFICE
CERTIFICATE OF CORRECTION

PATENT NO.        : 7,514,865 B2                                         Page 1 of 1
APPLICATION NO.   : 11/114113
DATED             : April 7, 2009
INVENTOR(S)       : Tetsuro Yamazaki et al.

It is certified that error appears in the above-identified patent and that said Letters Patent is hereby corrected as shown below:

Title page, should read (*) Notice:    Subject to any disclaimer, the term of this patent is extended or adjusted under 35 U.S.C. 154(b) by 529 days. -- The term of this patent shall not extend beyond the expiration date of Patent No. 7,071,611. --

Signed and Sealed this

Eleventh Day of August, 2009

David J. Kappos
*Director of the United States Patent and Trademark Office*